United States Patent
Liu et al.

(10) Patent No.: US 11,133,331 B2
(45) Date of Patent: *Sep. 28, 2021

(54) INTEGRATED TENSILE STRAINED SILICON NFET AND COMPRESSIVE STRAINED SILICON-GERMANIUM PFET IMPLEMENTED IN FINFET TECHNOLOGY

(71) Applicant: STMicroelectronics, Inc., Coppell, TX (US)

(72) Inventors: Qing Liu, Irvine, CA (US); Pierre Morin, Kessel-Lo (BE)

(73) Assignee: STMicroelectronics, Inc., Coppell, TX (US)

( * ) Notice: Subject to any disclaimer, the term of this patent is extended or adjusted under 35 U.S.C. 154(b) by 32 days.

This patent is subject to a terminal disclaimer.

(21) Appl. No.: 16/180,223

(22) Filed: Nov. 5, 2018

(65) Prior Publication Data

US 2019/0081079 A1 Mar. 14, 2019

Related U.S. Application Data

(60) Continuation of application No. 15/432,492, filed on Feb. 14, 2017, now abandoned, which is a division of
(Continued)

(51) Int. Cl.
*H01L 29/06* (2006.01)
*H01L 27/12* (2006.01)
(Continued)

(52) U.S. Cl.
CPC ...... *H01L 27/1211* (2013.01); *H01L 21/0217* (2013.01); *H01L 21/02164* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 9,190,329 B1 11/2015 Cheng et al.
9,607,901 B2 * 3/2017 Liu .................. H01L 29/66795
(Continued)

OTHER PUBLICATIONS

Search Report and Written Opinion for co-pending DE Application No. 1020015120488.6 (10 pages).

*Primary Examiner* — Suberr L Chi
(74) *Attorney, Agent, or Firm* — Crowe & Dunlevy

(57) ABSTRACT

A tensile strained silicon layer is patterned to form a first group of fins in a first substrate area and a second group of fins in a second substrate area. The second group of fins is covered with a tensile strained material, and an anneal is performed to relax the tensile strained silicon semiconductor material in the second group of fins and produce relaxed silicon semiconductor fins in the second area. The first group of fins is covered with a mask, and silicon-germanium material is provided on the relaxed silicon semiconductor fins. Germanium from the silicon germanium material is then driven into the relaxed silicon semiconductor fins to produce compressive strained silicon-germanium semiconductor fins in the second substrate area (from which p-channel finFET devices are formed). The mask is removed to reveal tensile strained silicon semiconductor fins in the first substrate area (from which n-channel finFET devices are formed).

9 Claims, 11 Drawing Sheets

Related U.S. Application Data application No. 14/705,291, filed on May 6, 2015, now Pat. No. 9,607,901.

(51) Int. Cl.

| | | |
|---|---|---|
| *H01L 21/8238* | (2006.01) | |
| *H01L 21/308* | (2006.01) | |
| *H01L 21/02* | (2006.01) | |
| *H01L 21/3105* | (2006.01) | |
| *H01L 21/324* | (2006.01) | |
| *H01L 27/092* | (2006.01) | |
| *H01L 21/84* | (2006.01) | |
| *H01L 29/10* | (2006.01) | |
| *H01L 29/66* | (2006.01) | |
| *H01L 29/78* | (2006.01) | |

(52) U.S. Cl.
CPC .. *H01L 21/02592* (2013.01); *H01L 21/02598* (2013.01); *H01L 21/02694* (2013.01); *H01L 21/3081* (2013.01); *H01L 21/31051* (2013.01); *H01L 21/324* (2013.01); *H01L 21/823807* (2013.01); *H01L 21/823821* (2013.01); *H01L 21/845* (2013.01); *H01L 27/0924* (2013.01); *H01L 29/0649* (2013.01); *H01L 29/1054* (2013.01); *H01L 29/66795* (2013.01); *H01L 29/785* (2013.01); *H01L 29/7849* (2013.01)

(58) Field of Classification Search
CPC . H01L 27/1211; H01L 29/7831; H01L 29/785
See application file for complete search history.

(56) References Cited

U.S. PATENT DOCUMENTS

| | | | |
|---|---|---|---|
| 2005/0130358 | A1 | 6/2005 | Chidambarrao et al. |
| 2006/0157794 | A1 | 7/2006 | Doyle et al. |
| 2009/0090934 | A1 | 4/2009 | Tezuka et al. |
| 2011/0027978 | A1 | 2/2011 | Hargrove et al. |
| 2012/0256274 | A1* | 10/2012 | Riess .................. H01L 27/095 257/408 |
| 2015/0118823 | A1 | 4/2015 | Nier et al. |
| 2015/0325686 | A1 | 11/2015 | Allibert et al. |
| 2016/0218192 | A1* | 7/2016 | Doris ................. H01L 27/0924 |

\* cited by examiner

INTEGRATED TENSILE STRAINED SILICON NFET AND COMPRESSIVE STRAINED SILICON-GERMANIUM PFET IMPLEMENTED IN FINFET TECHNOLOGY

CROSS REFERENCE TO RELATED APPLICATIONS

This application is a continuation of U.S. application patent Ser. No. 15/432,492 filed Feb. 14, 2017, now abandoned, which is a divisional of U.S. application patent Ser. No. 14/705,291 filed May 6, 2015, now U.S. Pat. No. 9,607,901, the disclosures of which are hereby incorporated by reference.

TECHNICAL FIELD

The present invention relates to integrated circuits and, in particular, to a field effect transistor (FET) device fabricated using a fin of semiconductor material wherein NFET devices utilize tensile strained silicon fin material and PFET devices utilize compressive strained silicon-germanium fin material.

BACKGROUND

It is recognized by those skilled in the art that tensile strained silicon (Si) material provides for increased electron mobility and improved performance with respect to n-channel metal oxide semiconductor (MOS) field effect transistor (FET) devices. However, many integrated circuit designs require the use of p-channel MOSFET devices as well. Circuits of this type are commonly referred to as complementary metal oxide semiconductor (CMOS) circuits. Unfortunately, tensile strained silicon material is detrimental to the operation of p-channel MOSFET devices which instead prefer compressive strained silicon-germanium (SiGe) material to boost hole mobility and improve performance. The integration of tensile strained silicon material and compressive strained silicon-germanium material on a common substrate in support of the fabrication of CMOS circuits has proven to be a challenge.

The prior art teaches the formation of integrated circuits which utilize FinFET type field effect transistors. The FinFET transistor comprises a channel region which is oriented to conduct an electrical current parallel to the surface of the substrate. The channel region is provided in an elongated section of semiconductor material referred to as a "fin." The source and drain regions of the transistor are formed in the elongated section on either side of the channel region. A gate is placed to straddle over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions which are separated from each other by an intermediate gate portion of the transistor gate spanning with a perpendicular orientation over the multiple elongated sections.

It is preferred for the fabrication of CMOS circuits with FinFET devices for the elongated section of semiconductor material (i.e., the fin) of the n-channel MOSFET devices to be made of tensile strained silicon material and for the elongated section of semiconductor material (i.e., the fin) of the p-channel MOSFET devices to be made of compressive strained silicon-germanium (SiGe) material. It has proven difficult, however, to obtain relaxation of the tensile strained silicon material on a substrate in order to support the formation of compressive strained silicon-germanium material. In other words, provision of both tensile strained silicon material and compressive strained silicon-germanium material on a substrate for supporting fins of CMOS circuits is challenging.

A need accordingly exists in the art for a method of manufacture which can integrate both tensile strained silicon material and compressive strained silicon-germanium material for the formation of CMOS FinFET devices.

SUMMARY

In an embodiment, a method comprises: depositing a hard mask on a tensile strained silicon semiconductor layer supported by a substrate; patterning said hard mask and tensile strained silicon semiconductor layer into a plurality of fins; performing an anneal which relaxes the tensile strained silicon semiconductor of the plurality of fins; providing silicon-germanium material on the plurality of fins; and driving germanium from the silicon germanium material into the plurality of fins to produce compressive strained silicon-germanium semiconductor fins.

In an embodiment, a method comprises: depositing a hard mask on a tensile strained semiconductor layer of a substrate; patterning said hard mask and tensile strained semiconductor layer into a plurality of fins; forming and patterning a tensile strained material so that the tensile strained material covers the plurality of fins; performing an anneal which relaxes the tensile strained semiconductor material in the plurality of fins resulting in a relatively lower tensile strain in the plurality of fins; forming a semiconductor material on the plurality of fins, the semiconductor material including germanium; and driving germanium from the semiconductor material into the plurality of fins to produce compressive strained semiconductor fins.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-21B which illustrate the process steps in the formation of CMOS FinFET devices. It will be understood that the drawings do not necessarily show features drawn to scale.

Figure 1:
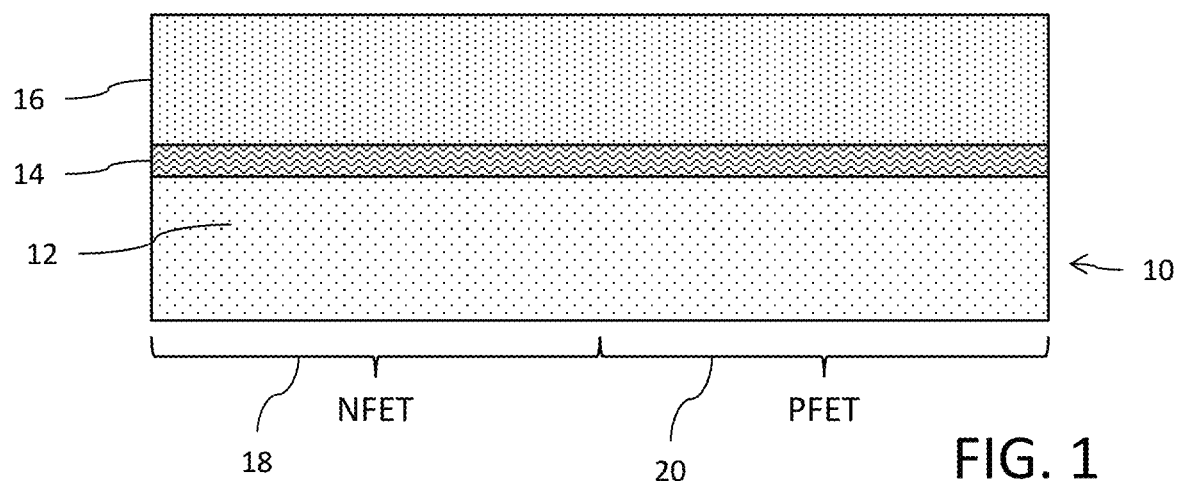
FIGS. 1-21B illustrate process steps in the formation of CMOS FinFET devices.

FIG. 1 shows a silicon on insulator (SOI) semiconductor substrate 10 comprising a semiconductor substrate 12, an insulating layer 14 and a tensile strained silicon semiconductor layer 16 in a stack of a wafer. Such a substrate is commonly referred to in the art by the acronym sSOI wherein the lower case "s" refers to the term "strained." The tensile strained silicon semiconductor layer 16 may be doped in accordance with the application, or alternatively may be un-doped in which case the sSOI substrate 10 is of the "fully-depleted" type. The tensile strained semiconductor layer 16 may, for example, have a thickness of 30-50 nm. The insulating layer 14 is commonly referred to in the art as a buried oxide (BOX) layer. The substrate 10 includes an area 18 which is reserved for the formation of first polarity (for example, n-channel) devices (NFET) and an area 20 which is reserved for the formation of second, opposite, polarity (for example, p-channel) devices (PFET).

Figure 2:
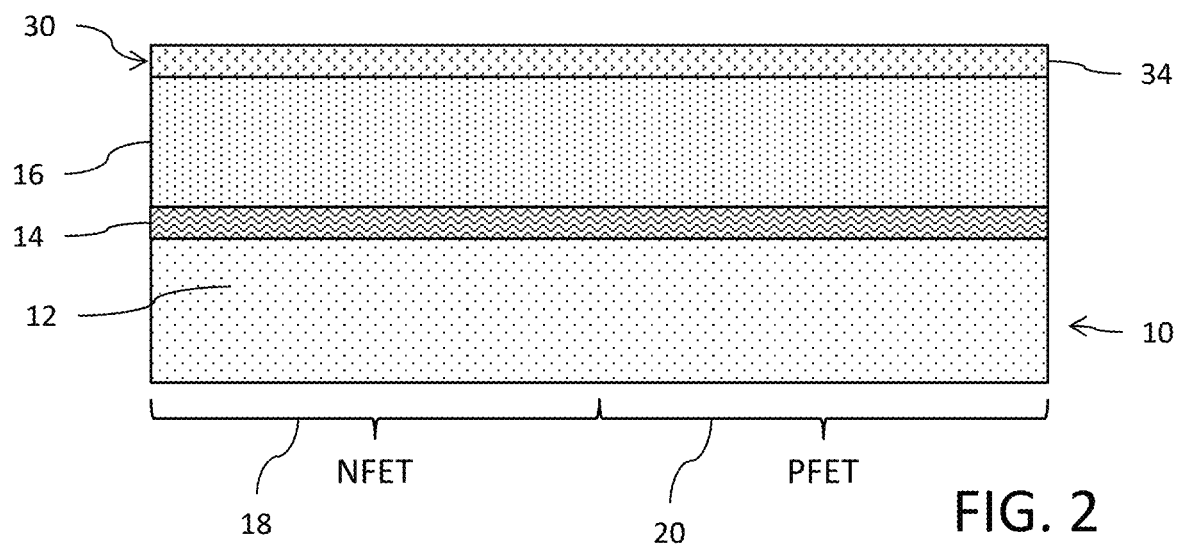

A hard mask 30 comprising a layer of silicon nitride (SiN) 34 is then deposited on the semiconductor layer 16. The silicon nitride layer 34 may, for example, be deposited using a chemical vapor deposition (CVD) process with a thickness of, for example, approximately 20 nm. The result is shown in FIG. 2.

Figure 3:
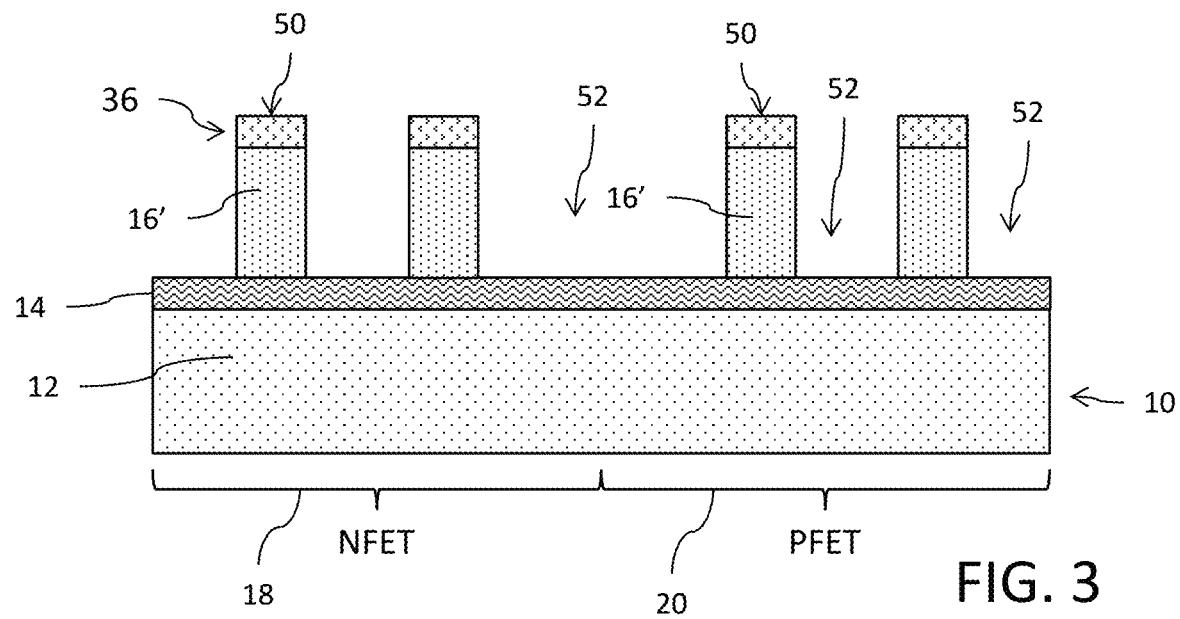
Figure 4:
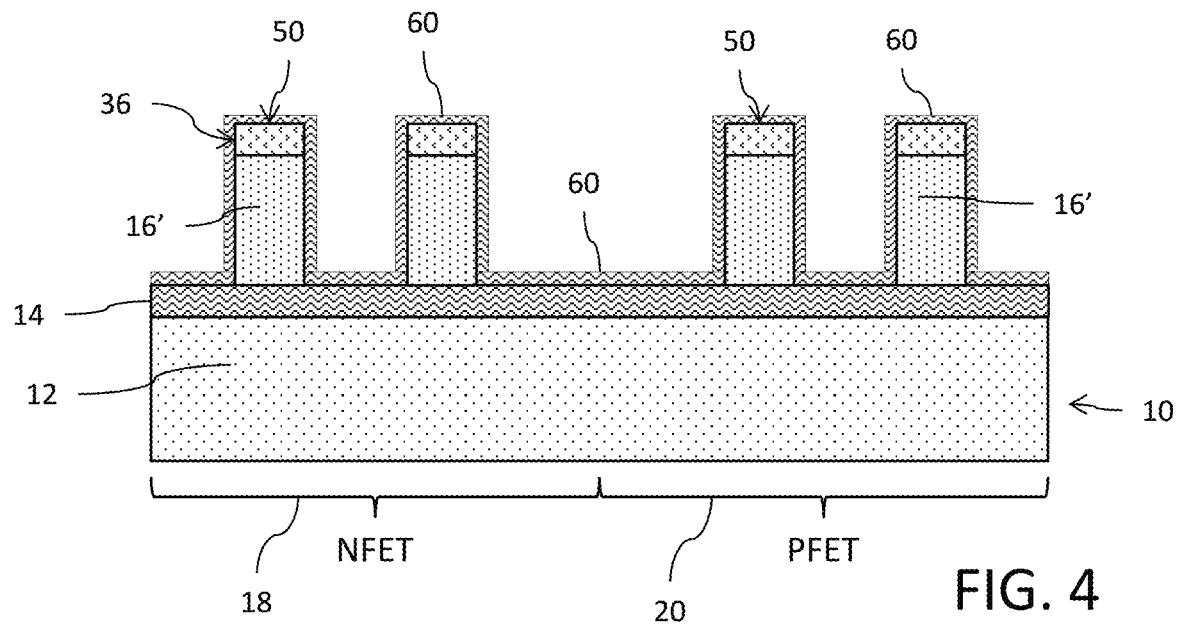

A lithographic process as known in the art is then used to define a plurality of fins 50 from the tensile strained silicon semiconductor layer 16. The hard mask 30 is patterned to leave mask material 36 at the desired locations of the fins 50. An etching operation, such as an anisotropic dry etch, is then performed through the mask to open apertures 52 in the layer 16 on each side of each fin 50. In a preferred embodiment with the sSOI substrate, for example, the etch defining the fins 50 extends to a depth which reaches the insulating layer 14. Each fin 50 is accordingly comprised of a tensile strained silicon semiconductor fin region 16' and the mask material 36. The fins 50 may have a width of 6-12 nm and a pitch of 25-30 nm (with a spacing between adjacent fins of 17-22 nm). The result of the etching process for fin formation is shown in FIG. 3.

Figure 5:
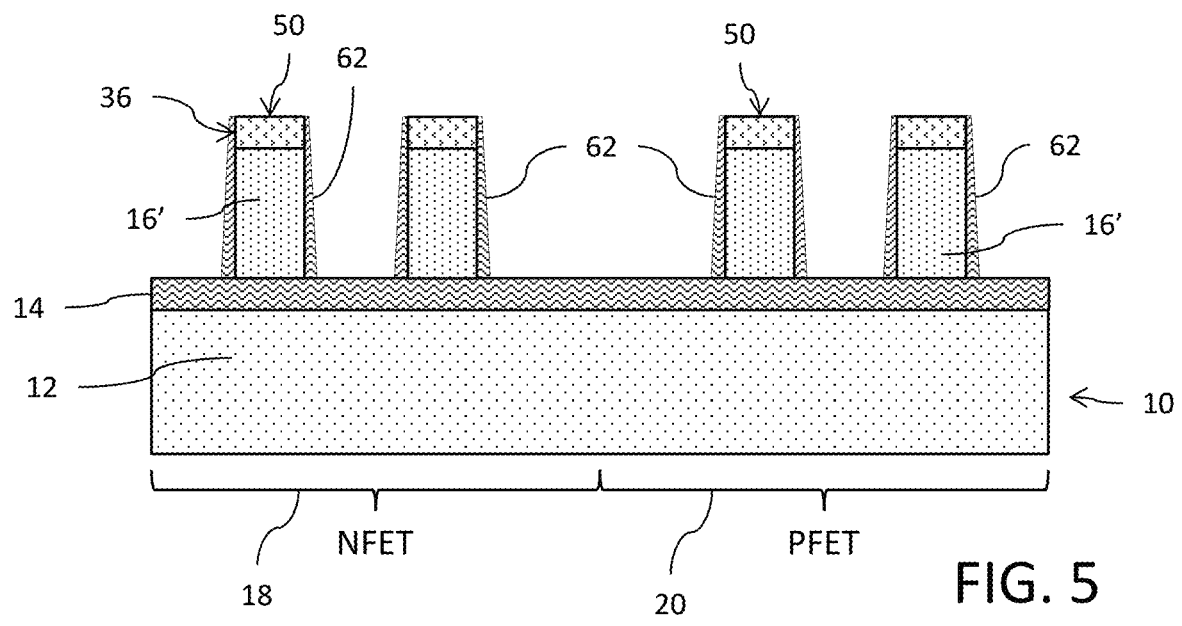
Figure 6:
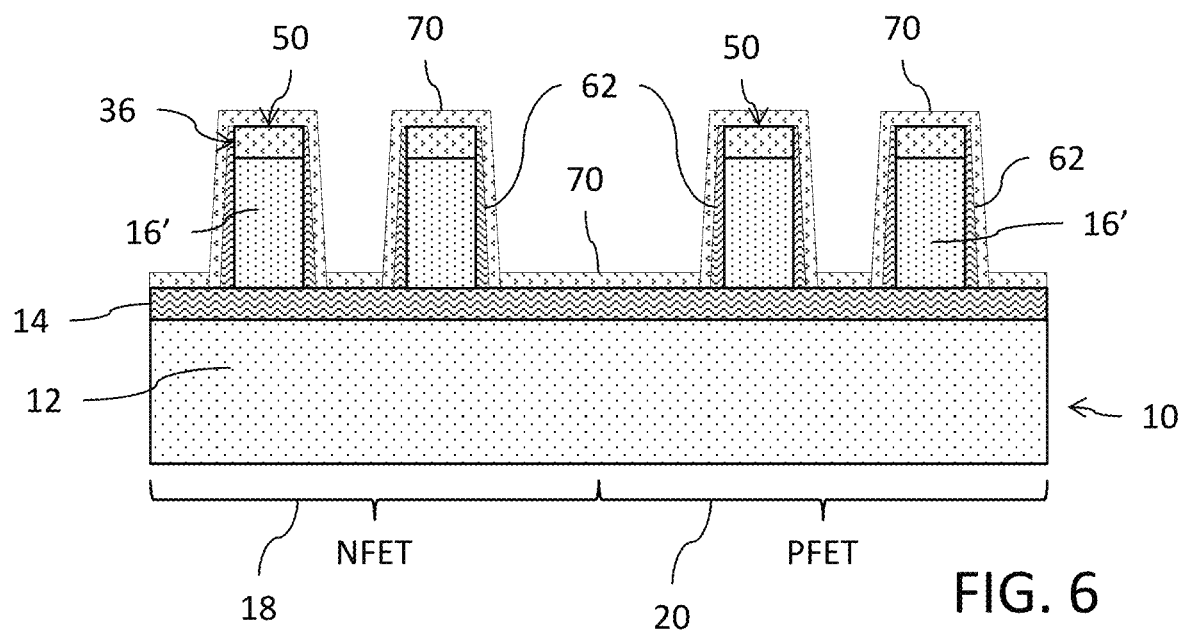

A conformal deposit of a layer 60 of silicon oxide ($SiO_2$) is then made using an atomic layer deposition technique. The layer 60 may have a thickness of approximately 3 nm. See, FIG. 4. A directional etch, such as a reactive ion etch (RIE), is then performed to define an oxide sidewall spacer 62 on each side of each fin 50. The result is shown in FIG. 5.

Figure 7:
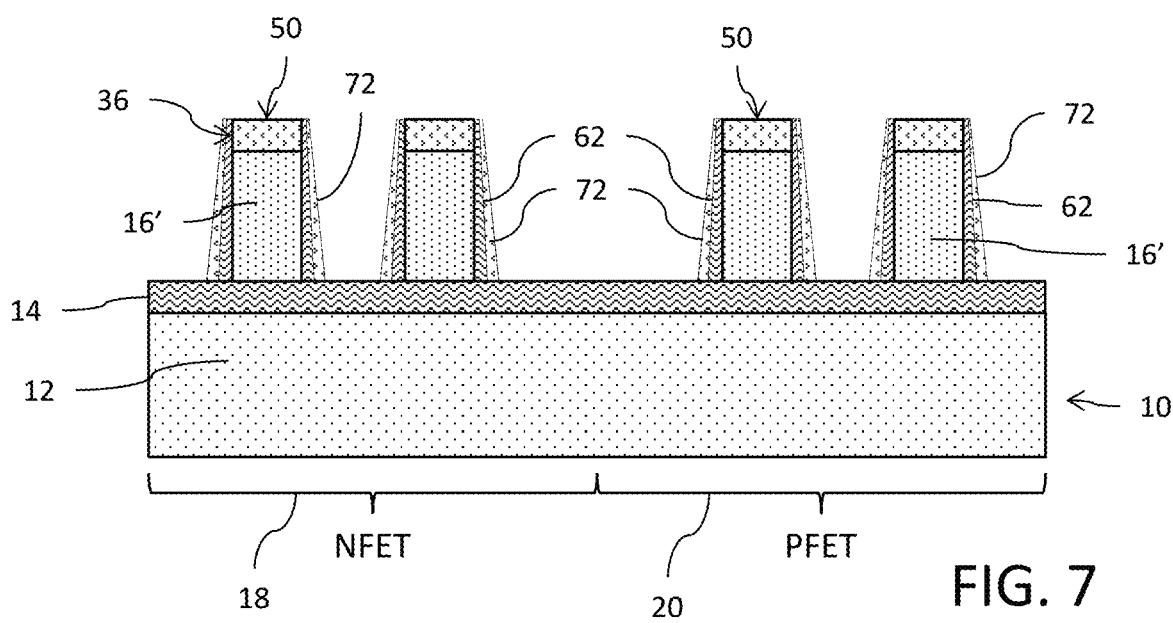
Figure 8:
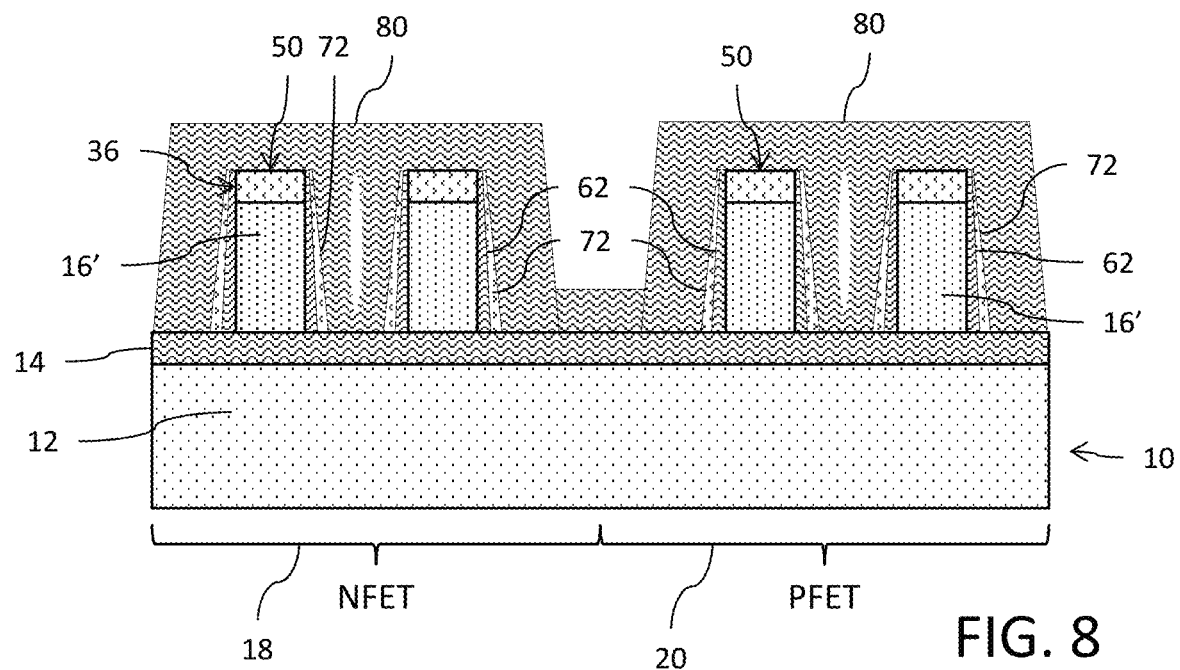

A conformal deposit of a layer 70 of silicon nitride (SiN) is then made using an atomic layer deposition technique. The layer 70 may have a thickness of approximately 3 nm. See, FIG. 6. A directional etch, such as a reactive ion etch (RIE), is then performed to define a nitride sidewall spacer 72 on each side of each fin 50. The result is shown in FIG. 7.

A conformal deposit of a layer 80 of silicon oxide ($SiO_2$) is then made using an atomic layer deposition technique. The layer 80 may have a thickness of approximately 10 nm. See, FIG. 8. Following the deposit of layer 80, the wafer is subjected to an anneal (for example, at a temperature of 1050° C. for 30 seconds) in order to effectuate a densification of the deposited oxide sidewall spacers 62 and nitride sidewall spacers 72. Densification in this case advantageously hardens the silicon oxide material so to make that material more difficult to remove or recess using conventional etch processes such as HF, COR or hot phosphoric acid.

Figure 9:
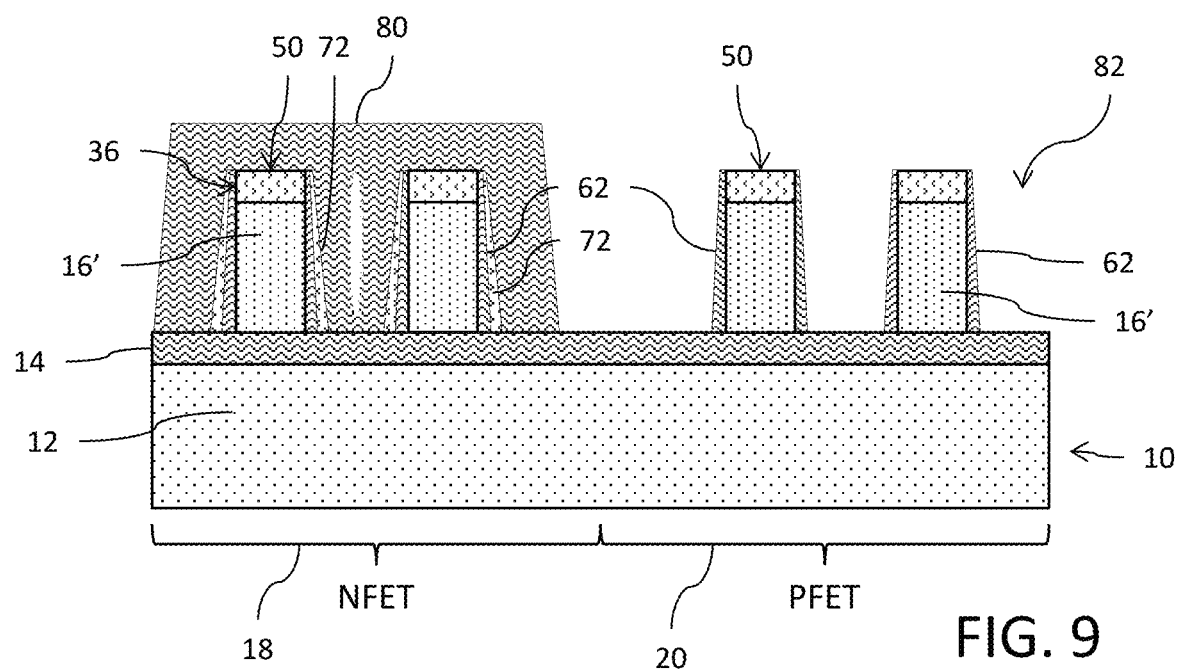

The area 18 reserved for the formation of n-channel devices (NFET) is then blocked off with a lithographic masking process and the area 20 reserved for the formation of p-channel devices (PFET) is opened (reference 82). This opening of the area 20 includes the removal of the layer 80 and the nitride sidewall spacers 72. Any resist present from the lithographic process to block off area 18 is then removed. The result is shown in FIG. 9.

It will be noted that an optional conformal deposit of a layer of silicon oxide ($SiO_2$) can be made at least with respect to the opened area 20 so as to cover and protect the mask material 36 for each fin 50. This layer is not explicitly shown in FIG. 9.

Figure 10:
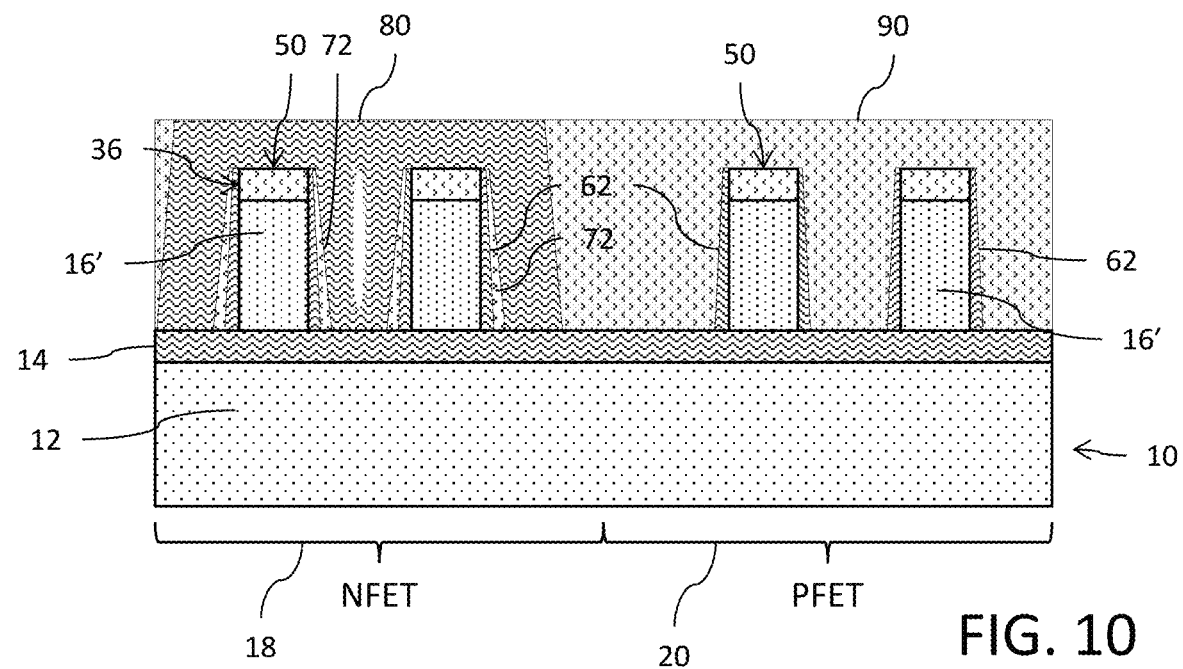

Next, a deposition of tensile strained silicon nitride (SiN) is made to fill the area 20. The deposit of silicon nitride material, as known in the art, can be tuned to provide either tensile or compressive stress by properly selecting the deposition parameters (temperature, pressure, etc.). A chemical-mechanical polishing (CMP) operation is then performed to planarize the tensile strained silicon nitride deposit at the top of the layer 80 of silicon oxide present in the area 18. The result is a tensile strained silicon nitride block 90 covering the fins 50 in the area 20 as shown in FIG. 10. For example, the tensile strain may range from 500 MPa to 1.5 GPa.

Figure 11:
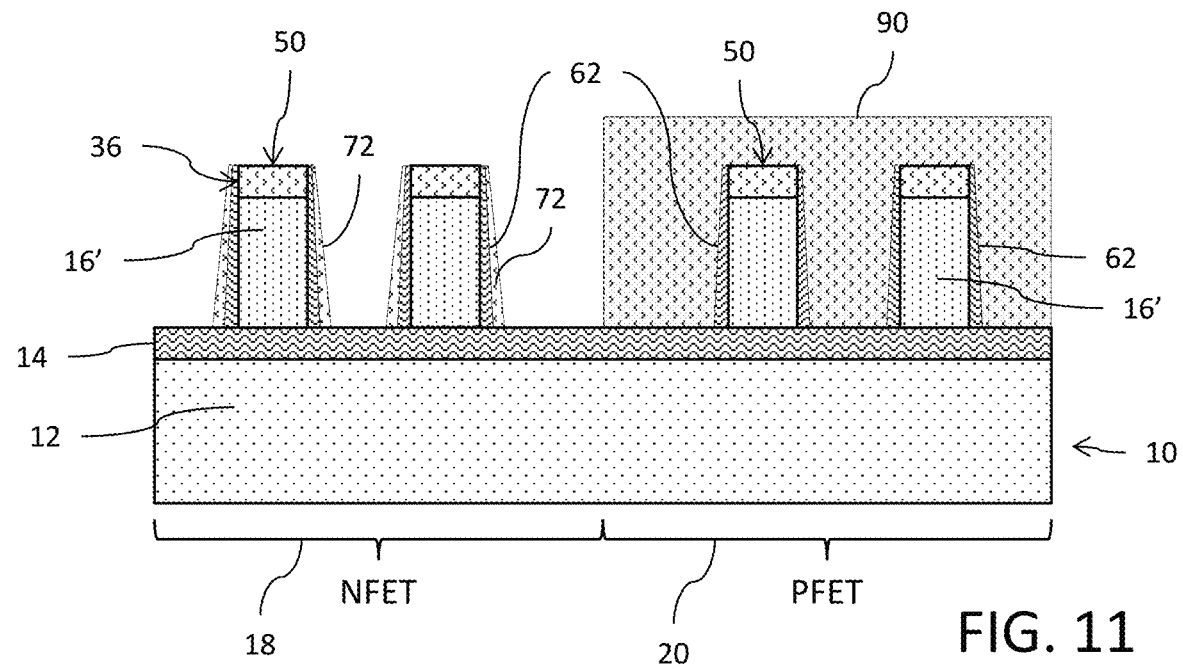

The layer 80 of silicon oxide in the area 18 is then removed using a BHF/HF etch. The result is shown in FIG. 11. It will be noted that as a result of the removal of layer 80 in the area 18, the tensile strained silicon nitride block 90 is fully cut-off from contact with the fins 50 in area 18 (i.e., the block 90 is not directly contacting the fins 50 or the sidewall spacers on the fins 50 in the area 18).

Figure 12:
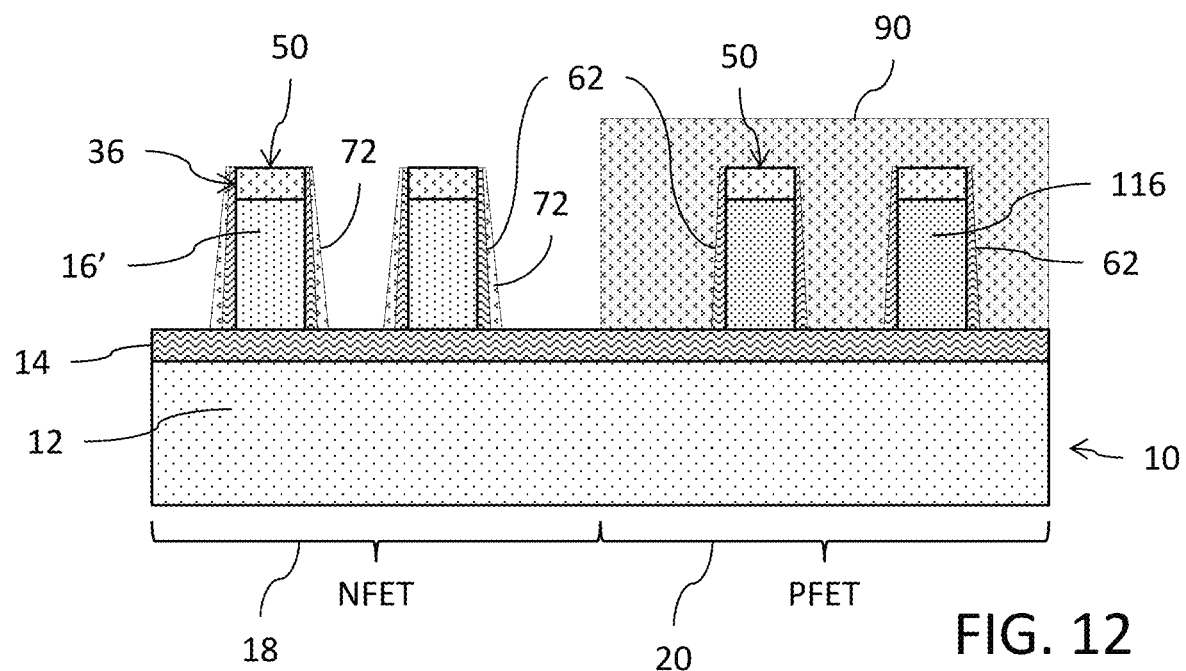

The substrate wafer is then subjected to a high temperature anneal (for example, at a temperature of 1200° C. for 2 minutes) so as to relax the strain in the area 20. This relaxation occurs due to the applied temperature and the close proximity of the tensile strained silicon nitride block 90 to the fins 50 in area 20 (i.e., the separation between materials is only by the thinned thickness of the sidewall spacers 62). As a result, the tensile strained silicon semiconductor fin region 16' of each fin 50 in area 20 is converted to a relaxed silicon semiconductor fin region 116. Depending on initial strain, the region 16' may have a strain of 1-1.5 GPa, while the region 116 after relaxation may have a strain of about 100 MPa. The result is shown in FIG. 12. It will be noted that the tensile strained silicon semiconductor fin region 16' of each fin 50 in area 18 is not relaxed (or to the extent relaxation occurs, such relaxation is minimal (for example, it will retain greater than 80% of its original strain) because there is no direct contact of the tensile strained silicon nitride block 90 to the fins 50 in area 18.

Figure 13:
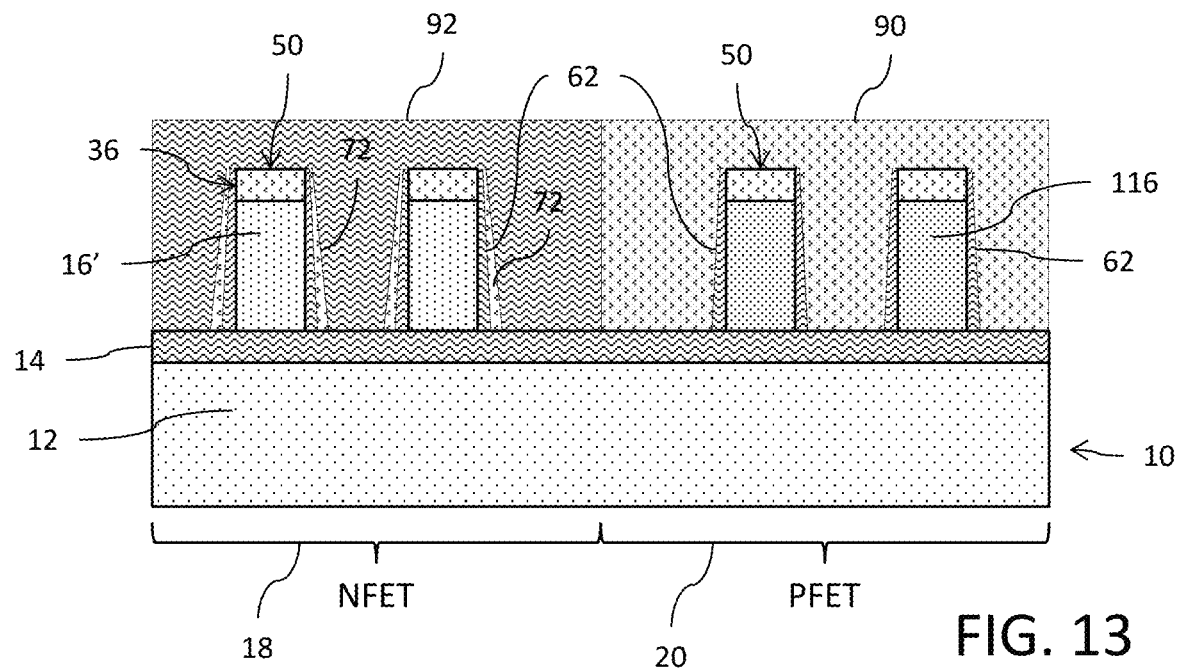

Next, a deposition of silicon oxide ($SiO_2$) is made to fill the area 18. This deposition is made using a flowable oxide process. A chemical-mechanical polishing (CMP) operation is then performed to planarize the silicon oxide deposit at the top of the tensile strained silicon nitride block 90 present in the area 20. The result is a silicon oxide block 92 covering the fins 50 in the area 18 as shown in FIG. 13.

Figure 14:
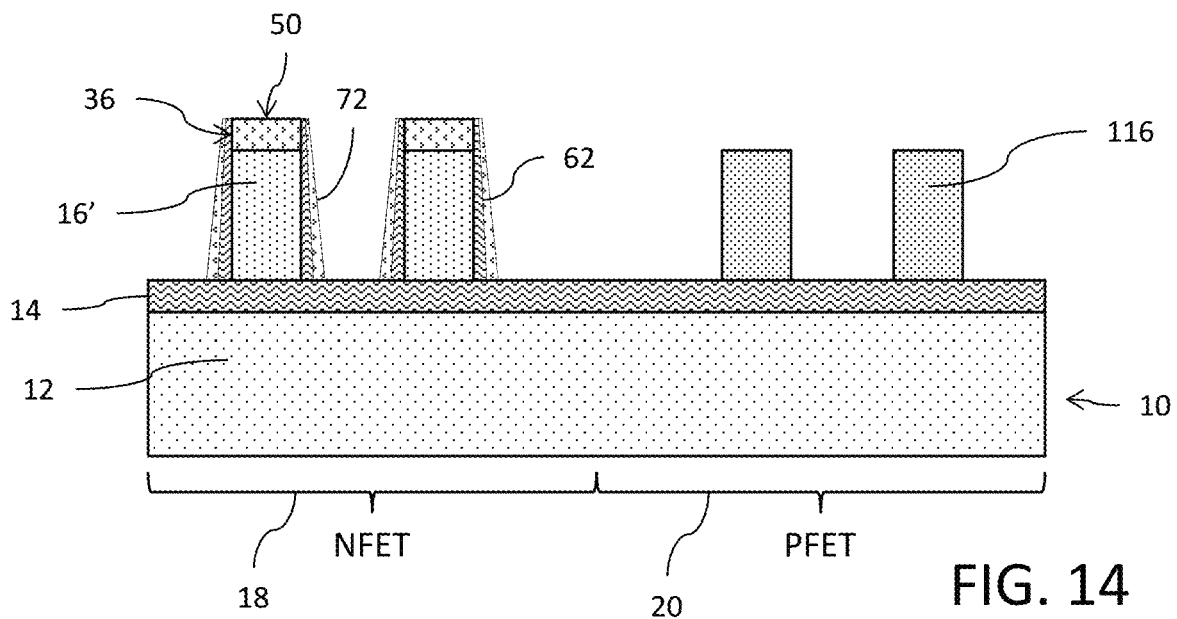

The tensile strained silicon nitride block 90 is then removed from covering the fins 50 in area 20. This removal is accomplished, for example, using a hot phosphorus etch that is selective to silicon oxide. An HF or COR etch process is then performed to remove silicon oxide. This process will remove all of the sidewall spacers 62 and mask material 36 from the fins 50 in area 20, thus leaving the relaxed silicon semiconductor fin regions 116, as well as remove all, or substantially all, of the silicon oxide block 92 covering the fins 50 in the area 18. The result is shown in FIG. 14. It will be noted, however, that the mask material 36, sidewall spacers 72 and sidewall spacers 62 covering the fins 50 in the area 18 remain in place to protect the fins 50 in area 18 during the next processing operations performed on the fins 50 in area 20.

Figure 15A:
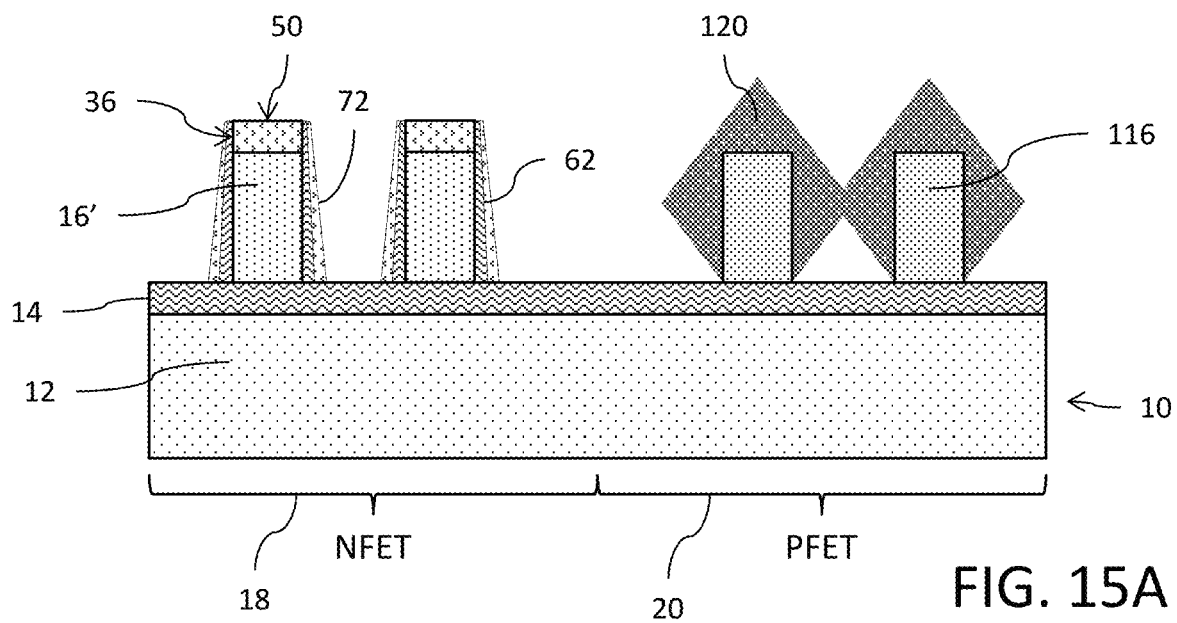
Figure 15B:
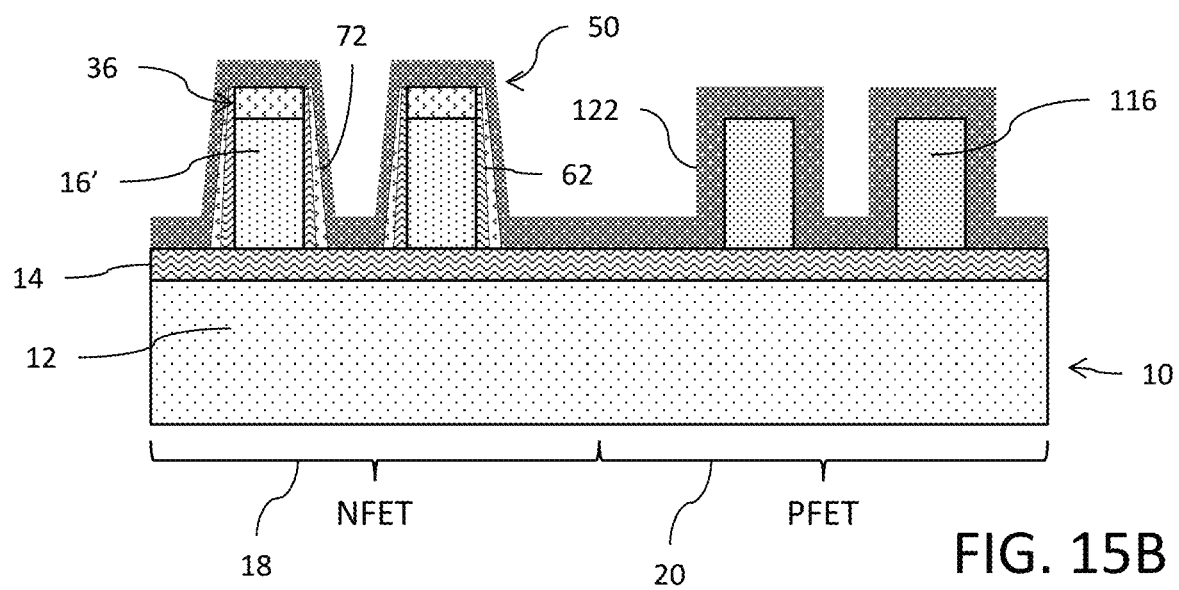
Figure 16:
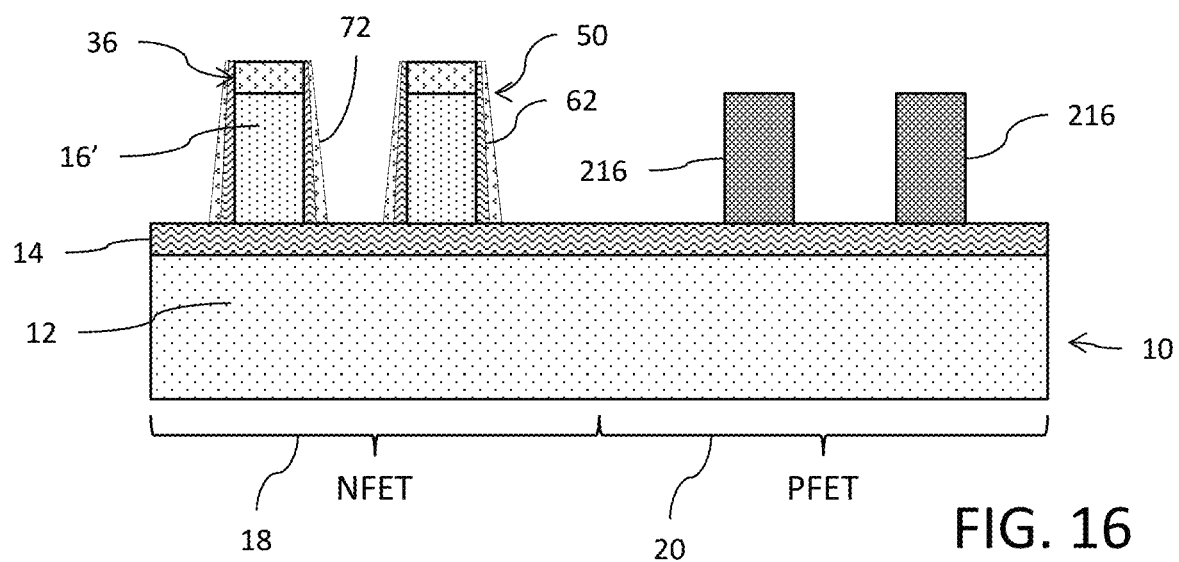

Two options are provided at this point with respect to the provision of silicon-germanium material in the region 20. In a first option, an epitaxial growth process is performed to grow an epitaxial silicon-germanium region 120 on the relaxed silicon semiconductor fin regions 116 as shown in FIG. 15A. In a second option, a non-selective epitaxy process is used to deposit an amorphous silicon-germanium layer 122 to cover the relaxed silicon semiconductor fin regions 116 as shown in FIG. 15B. Although the amorphous layer 122 will also cover the fins 50 in the area 18, it will be noted that the mask material 36, sidewall spacers 72 and sidewall spacers 62 remain in place to cover the fins 50. A condensation process is then performed to drive germanium from the region 120 or layer 122 into the relaxed silicon semiconductor fin regions 116 and produce compressively strained silicon germanium fin regions 216. The condensation may, for example, comprise an oxidation process using a 900° C. oxidation followed by a 1000° C. $N_2$ anneal. The silicon oxide and/or germanium oxide produced from the condensation process are then removed. The result is shown in FIG. 16.

Figure 17:
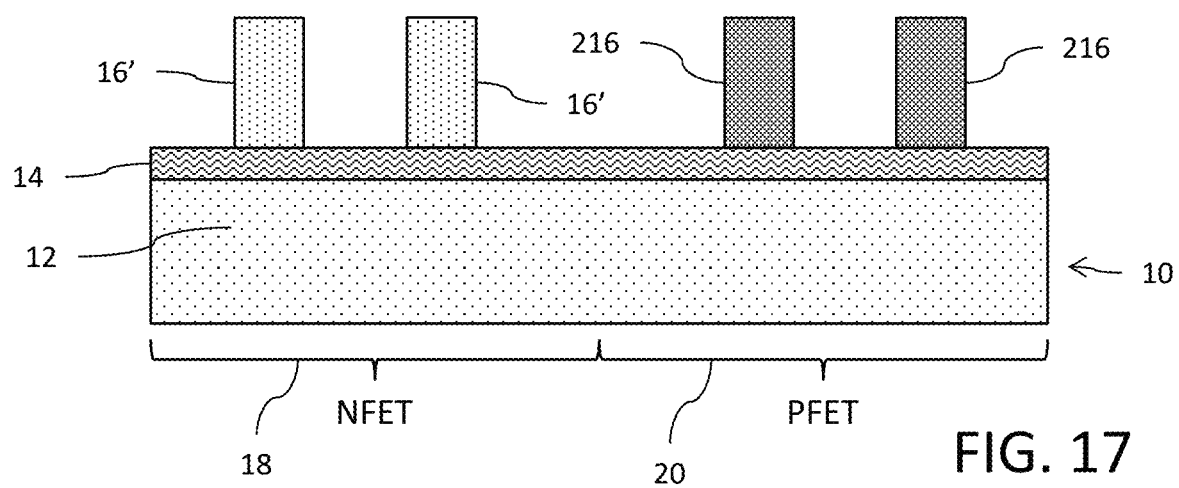

Using a sequence of hot phosphoric acid, hydrofluoric acid and hot phosphoric acid washes, the mask material 36, sidewall spacers 72 and sidewall spacers 62 for the fins 50 in the area 18 are removed. The result is shown in FIG. 17 with the area 18 including tensile strained silicon semiconductor fin regions 16' and the area 20 including compressive strained silicon germanium fin regions 216. It will be noted that if a concern exists with respect to consumption of the silicon germanium material of the compressive strained silicon germanium fin regions 216 during the sequence of hot phosphoric acid, hydrofluoric acid and hot phosphoric acid washes, the compressive strained silicon germanium fin regions 216 may first be protected by a thin layer of silicon oxide (approximately 5 nm), with the silicon oxide layer lithographically processed and removed from area 18. The hot phosphoric acid wash is then used to remove the silicon nitride mask and spacer. The hydrofluoric acid wash is then used to remove silicon dioxide spacer and protection layer.

A sacrificial polysilicon material 240 is deposited using a conventional chemical vapor deposition (CVD) process to cover the tensile strained silicon semiconductor fin regions 16' and the compressive strained silicon germanium fin regions 216. The polysilicon material 240 may, in an alternative implementation, instead comprise amorphous silicon. A conformal oxide (not explicitly shown) may be formed on the exposed surfaces of the fin regions 16' and 216 prior to deposition of the polysilicon material 240. As understood by those skilled in the art, the polysilicon material (with the oxide) is associated with the formation of structures commonly referred to as "dummy gate" structures. The polysilicon material of the dummy gate structures will be subsequently removed later in the fabrication process and replaced with a metal gate stack defining the actual operating gate electrode for the transistor devices (this process referred to in the art as a "replacement metal gate (RMG)" process). Thus, there is no need to dope the polysilicon material 240. The deposit of the polysilicon material 240 will have a height in excess of the height of the fin regions 16' and 216 so that the fins will be completely covered. The material 240 may have a thickness, for example, of 60-100 nm. The top surface of the polysilicon material 240 deposit is planarized using conventional chemical-mechanical polishing (CMP) techniques to provide a planar top surface.

A hard mask layer 242 with a thickness of 20-40 nm is deposited on the planar top surface of the polysilicon material 240 using a chemical vapor deposition (CVD) process. The layer 242 is lithographically patterned in a manner well known to those skilled in the art to leave mask material 244 at desired locations for the dummy gate structures. A reactive ion etch (ME) is then performed to open apertures 246 in the polysilicon material on either side of the dummy gate 248. The structure of the dummy gate 248 may be considered to straddle over each of the fin regions 16' and 216, or over a plurality of adjacent fin regions, at a channel region (see, FIG. 18A).

Figure 18A:
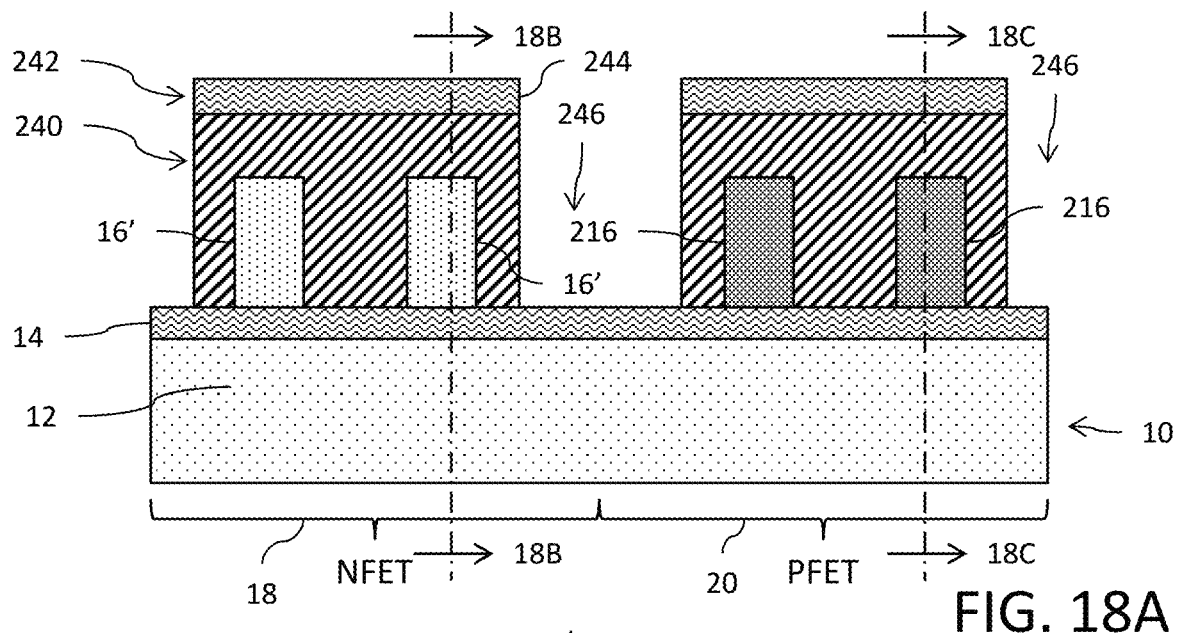
Figure 18B:
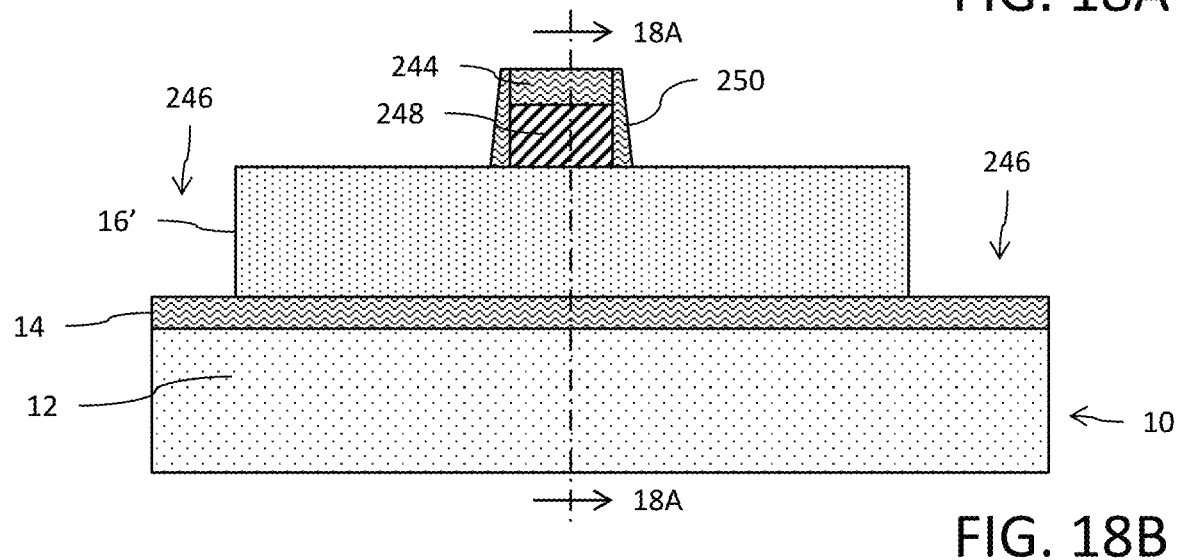
Figure 18C:
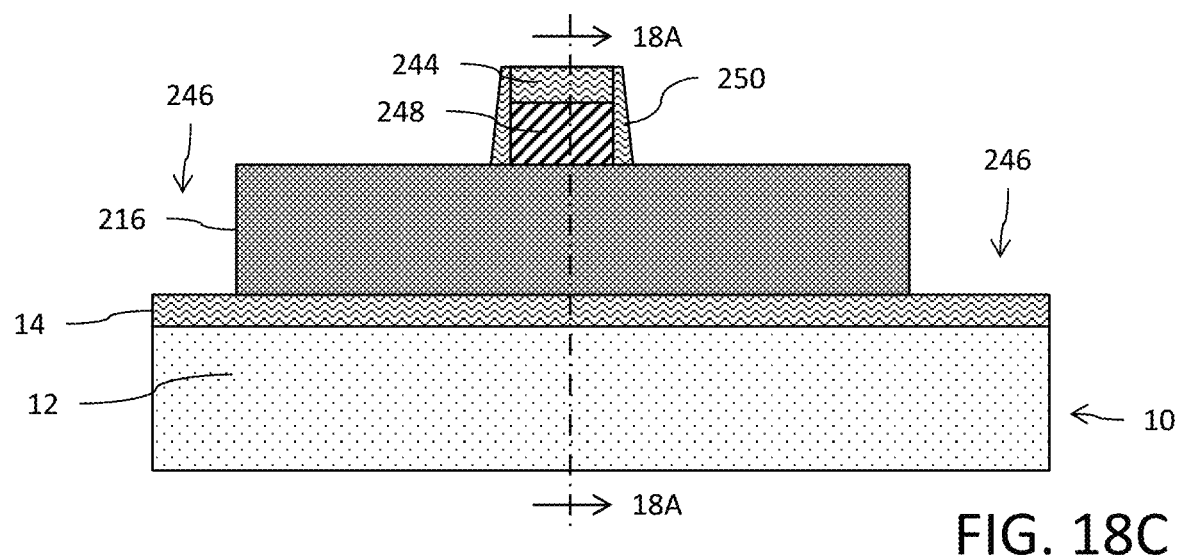

A silicon nitride material is then conformally deposited, for example, using an atomic layer deposition (ALD) technique as known in the art, and subsequently etched preferentially on the horizontal surfaces to leave sidewall spacers 250 on the side walls of the polysilicon dummy gates 248 (see, FIGS. 18B and 18C).

The dummy gate structure accordingly comprises a patterned polysilicon (or amorphous silicon) dummy gate 248, an overlying silicon nitride cap (formed by the mask material 244) and sidewall spacers 250. Although not specifically shown in FIGS. 18B and 18C, dummy gate structures may also be formed at the ends of each of the fin regions 16' and 216 in accordance with the known technique of gate tuck-under.

Figure 19A:
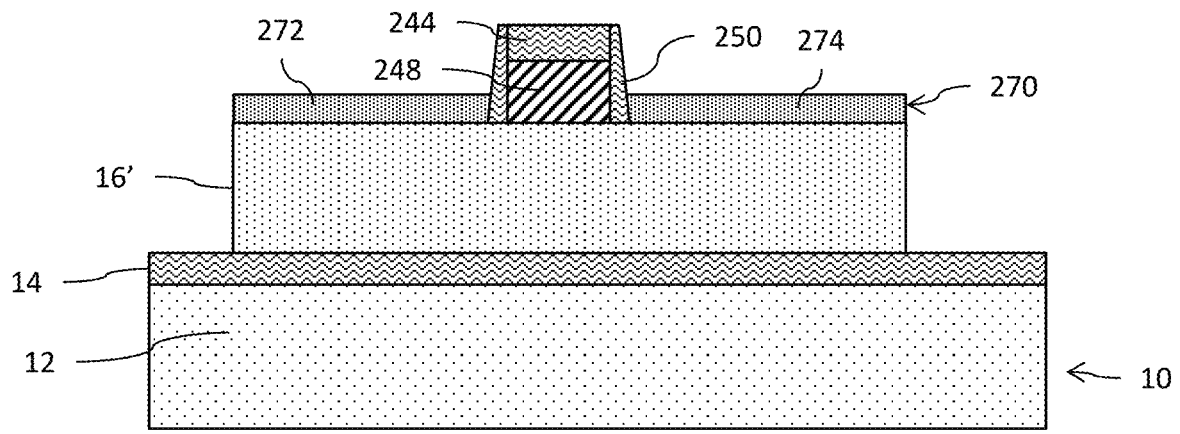
Figure 19B:
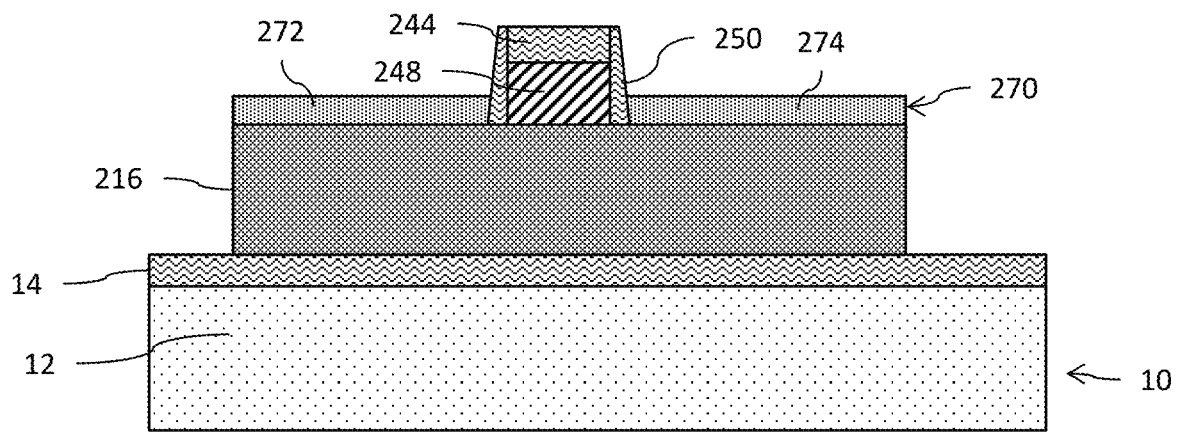

Using an epitaxial process tool and starting from the exposed surfaces of the fin regions 16' and 216, an epitaxial growth 270 of a silicon-based semiconductor material is made. The epitaxial growth 270 extends above the top surface of the fins to regions adjacent the sidewall spacers 250 on either side of the dummy gate structures. The silicon-based epitaxial growth 270 may be in situ doped as needed for a given application. As a result of the epitaxial growth 270, raised source and drain regions 272 and 274, respectively, are formed on either side of the dummy gate structures. The result is shown in FIGS. 19A-19B. The epitaxial growth 70 may comprise, for example: silicon or silicon-carbide doped with phosphorous or arsenic to a doping concentration of $1\times10^{20}$ to $5\times10^{20}$ at/cm$^3$ for the fin regions 16' in the NFET area 18. The epitaxial growth 70 may comprise, for example: silicon-germanium doped with boron to a doping concentration of $1\times10^{20}$ to $5\times10^{20}$ at/cm$^3$ for the fin regions 216 in the PFET area 20. Appropriate lithographic masking processes as known in the art are used to separately open the areas 18 and 20 to accommodate selective epitaxial growth in each region.

Figure 20A:
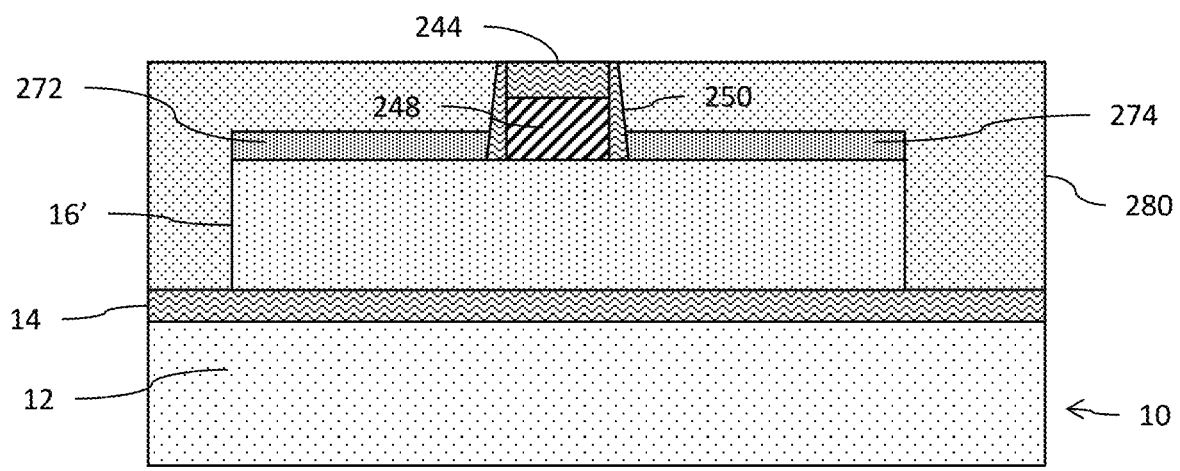
Figure 20B:
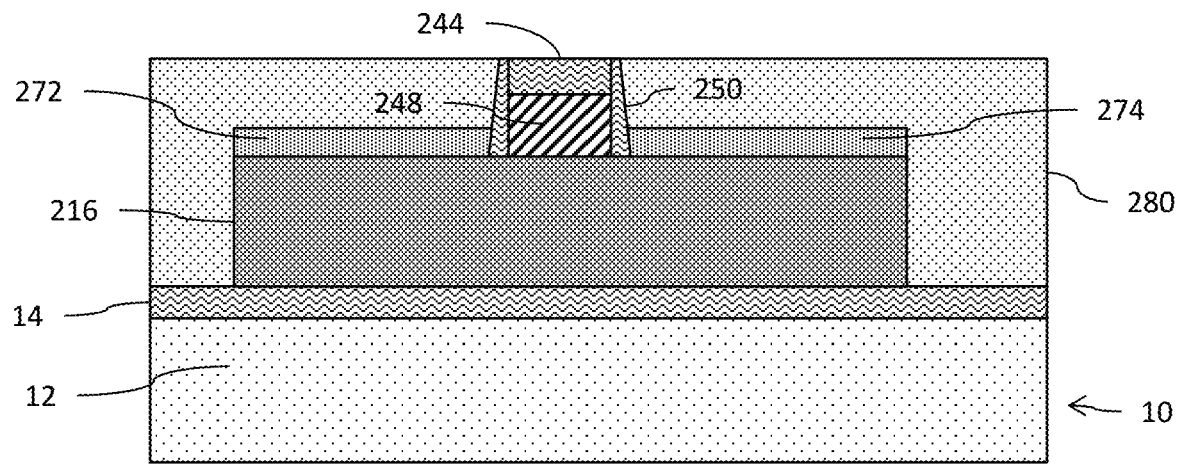

Reference is now made to FIGS. 20A-20B. A silicon dioxide material 280 is deposited to cover the substrate. The material 280 may be further processed using conventional chemical-mechanical polishing (CMP) techniques to provide a planar top surface that stops at the top of each dummy gate structure.

Figure 21A:
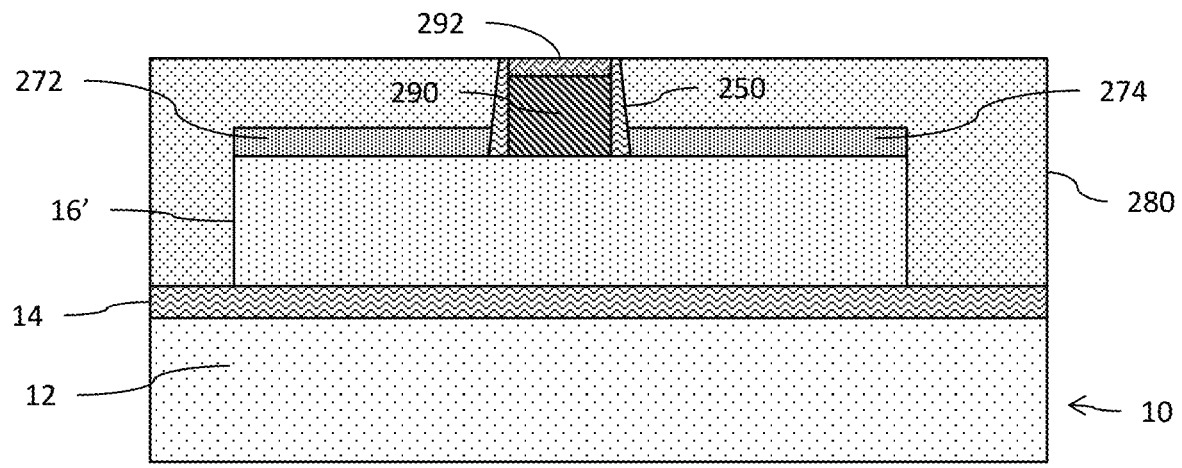
Figure 21B:
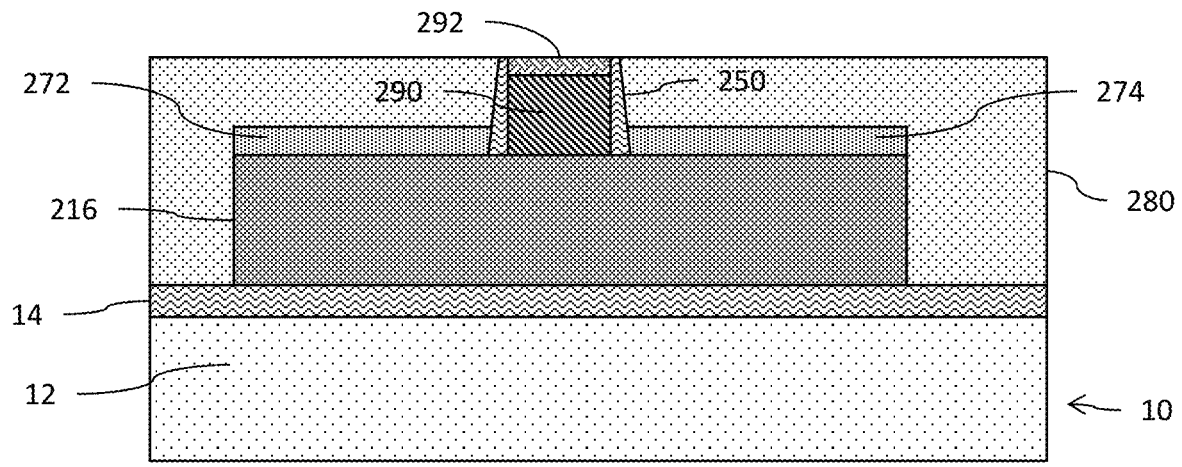

Using a selective removal process (such as an ammonium hydroxide etch), the dummy gates 248 are removed. The removed dummy gates 248 are then replaced with a metal gate structure 290. In an example, the metal gate structure may comprise a high-K dielectric liner (forming the gate dielectric for the transistor) deposited using an atomic layer deposition (ALD) process with a thickness of 1-2 nm, a work function metal deposited using a chemical vapor deposition process and a contact metal fill deposited using a chemical vapor deposition process. An insulating cap 292 covers the metal gate structure 290. The result is shown in FIGS. 21A-21B.

Further processing well known to those skilled in the art is then performed to produce the metal contacts to the gate (metal gate structure 290), source region 272 and drain region 274. For example, additional silicon dioxide material may be deposited to complete the formation of a pre-metallization dielectric (PMD) level for the integrated circuit. This material may be further processed using conventional chemical-mechanical polishing (CMP) techniques to provide a planar top surface. A hard mask layer, for example an organic planarization layer (OPL), is then deposited on the planar top surface of the PMD layer using a coating process. The OPL is then lithographically patterned in a manner well known to those skilled in the art to form openings at desired locations for making electrical contact to the gate, source region and drain region. A reactive ion etch (RIE) is then performed to open and extend apertures completely through the pre-metallization dielectric (PMD)

to expose a top surface of the gate metal and the epitaxial growth of the source and drain regions. The OPL is then removed. The apertures are then filled with metal material(s) to define a contact made to each of the gate, source region and drain region of the transistor. As necessary, a conventional chemical-mechanical polishing (CMP) technique may be used to remove excess metal so as to provide a planar top surface. The metal materials defining the contacts may, for example, comprise tungsten deposited using a chemical vapor deposition process. The fabrication process is compatible with the formation of a silicide at the bottom of the source and drain contacts. The techniques for salicidation are well known to those skilled in the art. The silicide may, for example, comprise a typical nickel platinum silicide or alternatively a silicide arising from the use of a titanium nitride liner for the contact.

At this point, front end of line (FEOL) fabrication of the integrated circuit is complete. Further back end of line (BEOL) processing to fabricate metallizations and interconnects may then be performed as well known to those skilled in the art.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
   depositing a hard mask on a tensile strained semiconductor layer of a substrate;
   patterning said hard mask and tensile strained semiconductor layer into a plurality of fins;
   forming and patterning a tensile strained material so that the tensile strained material covers the plurality of fins;
   performing an anneal which relaxes the tensile strained semiconductor material in the plurality of fins resulting in a relatively lower tensile strain in the plurality of fins;
   forming a semiconductor material on the plurality of fins, the semiconductor material including germanium; and
   driving germanium from the semiconductor material into the plurality of fins to produce compressive strained semiconductor fins.

2. The method of claim 1, further comprising using the compressive strained semiconductor fins to produce finFET transistors.

3. The method of claim 2, wherein the finFET transistors are p-type transistors.

4. The method of claim 1, wherein the tensile strained material is tensile strained silicon nitride.

5. The method of claim 1, wherein forming the semiconductor material comprises epitaxially growing semiconductor material including germanium on exposed semiconductor surfaces of the plurality of fins.

6. The method of claim 1, wherein forming the semiconductor material comprises depositing amorphous semiconductor material including germanium On exposed semiconductor surfaces of the plurality of fins.

7. The method of claim 1, further comprising producing finFET transistors using the compressive strained semiconductor fins by:
   forming a dummy gate extending over the compressive strained semiconductor fins, said dummy gate including a polysilicon material;
   forming sidewall spacers on the dummy gate; and
   replacing the polysilicon material of the dummy gate with a replacement metal gate structure.

8. The method of claim 1, wherein the substrate is a silicon on insulator type substrate.

9. The method of claim 7, wherein forming sidewall spacers comprises:
   forming an oxide sidewall spacer; and
   forming a nitride sidewall spacer on the oxide sidewall spacer.

* * * * *

UNITED STATES PATENT AND TRADEMARK OFFICE
CERTIFICATE OF CORRECTION

| | |
|---|---|
| PATENT NO. | : 11,133,331 B2 |
| APPLICATION NO. | : 16/180223 |
| DATED | : September 28, 2021 |
| INVENTOR(S) | : Qing Liu et al. |

Page 1 of 1

It is certified that error appears in the above-identified patent and that said Letters Patent is hereby corrected as shown below:

In the Specification

At Column 5, Line number 59, please replace the term [[(ME)]] with the term -- (RIE) --.

Signed and Sealed this
Twenty-sixth Day of April, 2022

Katherine Kelly Vidal
*Director of the United States Patent and Trademark Office*